(12) United States Patent
Vo

(10) Patent No.: US 8,068,374 B2
(45) Date of Patent: *Nov. 29, 2011

(54) CURRENT MODE MEMORY APPARATUS, SYSTEMS, AND METHODS

(75) Inventor: Huy T. Vo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 71 days.

This patent is subject to a terminal disclaimer.

(21) Appl. No.: 12/625,035

(22) Filed: Nov. 24, 2009

(65) Prior Publication Data

US 2010/0074036 A1 Mar. 25, 2010

Related U.S. Application Data

(63) Continuation of application No. 11/828,197, filed on Jul. 25, 2007, now Pat. No. 7,633,821.

(51) Int. Cl.
*G11C 7/00* (2006.01)
(52) U.S. Cl. ........................................ 365/205; 365/206
(58) Field of Classification Search .................. 365/205, 365/206, 207
See application file for complete search history.

(56) References Cited

U.S. PATENT DOCUMENTS

| | | | | |
|---|---|---|---|---|
| 5,963,495 A | * | 10/1999 | Kumar | ........................... 365/207 |
| 7,126,868 B2 | | 10/2006 | Mizuno et al. | |
| 2009/0027090 A1 | | 1/2009 | Vo | |

OTHER PUBLICATIONS

Seevinck, E., et al., "Current-Mode Techniques for High-Speed VLSI Circuits with Application to Current Sense Amplifier for CMOS SRAM's", *IEEE Journal of Solid State Circuits*, 26(4), (Apr. 1991), pp. 525-536.

* cited by examiner

*Primary Examiner* — Vu Le
(74) *Attorney, Agent, or Firm* — Schwegman, Lundberg & Woessner, P.A.

(57) ABSTRACT

Some embodiments include a first circuit to drive signals at first circuit output nodes, and a second circuit to generate output signals at second circuit output nodes. The second circuit includes a first transistor coupled between a supply node and a first node of the second circuit output nodes and a second transistor coupled between the supply node and a second node of the second circuit output nodes. Each of the first and second transistors includes a gate coupled to one of the first and second nodes. Other embodiments including additional apparatus, systems, and methods are disclosed.

20 Claims, 8 Drawing Sheets

CURRENT MODE MEMORY APPARATUS, SYSTEMS, AND METHODS

RELATED APPLICATION

This application is a continuation of U.S. application Ser. No. 11/828,197, filed Jul. 25, 2007 now U.S. Pat. No. 7,633, 821, which is incorporated herein its entirety by reference.

FIELD

Embodiments disclosed herein relate to semiconductor devices.

BACKGROUND

Semiconductor devices, including memory, often are used in computers and electronic products, e.g., digital televisions, digital cameras, and cellular phones, to store data and other information. A memory device often has many memory cells and associated circuits to transfer data to and from the memory cells. The circuits may transfer the data in the form of electrical signals. A signal may have one or more signal level values to represent different values of the data.

In some cases, a circuit used to transfer data within a memory device that operates at one operating supply voltage may function poorly in a memory device that operates at another supply voltage, e.g., a lower supply voltage. In other cases, factors such as fabrication process variations may put a circuit used to transfer data within a memory device under conditions that degrade signal level values of the signals transferred by the circuit, leading to lower transfer speed, higher power consumption, or both.

DETAILED DESCRIPTION

Figure 1:
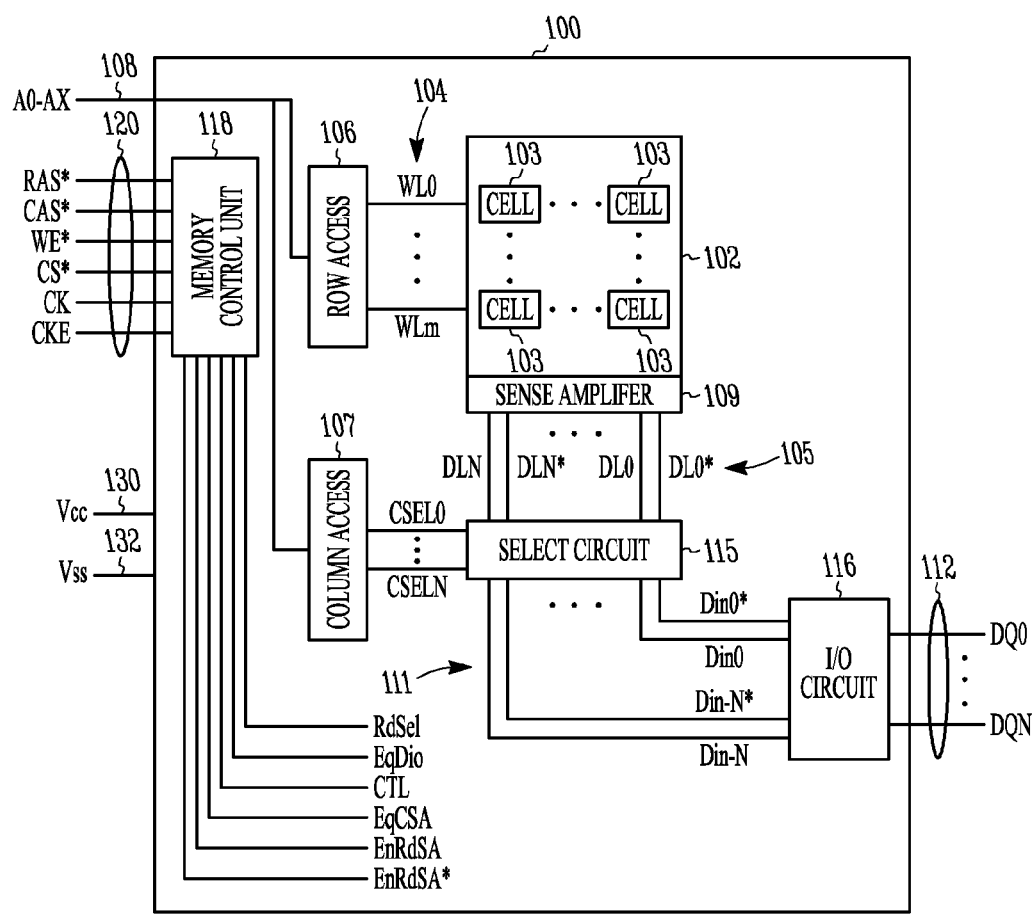
FIG. 1 shows a block diagram of a memory device according to an embodiment of the invention.

FIG. 1 shows a memory device 100 according to an embodiment of the invention. Memory device 100 may include a memory array 102 having memory cells 103 arranged in rows and columns along with wordlines 104 (having signals WL0 through WLm) and digit lines 105 (having signals DL0, DL0*, . . . , DLN, and DLN*). Memory device 100 may use wordlines 104 to access memory cells 103 and the digit lines 105 to transfer data to/from memory cells 103. Row and column access circuits 106 and 107 may decode address signals A0 through AX on address lines 108 to determine which memory cells 103 are to be accessed. A sense amplifier circuit 109 may sense the voltage on bit lines 105 to determine the value of data read from or written to memory cells 103. Memory device 100 may include circuitry 111 to transfer data between memory array 102 and data lines 112, which carry signals DQ0 through DQN.

Memory device 100 may be capable of executing memory operations such as a read operation to read data from memory cells 103 and a write operation to write data into memory cells 103. A memory control unit 118 may control the memory operations, e.g., read and write operations, based on control signals on control lines 120. Examples of control signals include a row access strobe signal RAS*, a column access strobe signal CAS*, a write enable signal WE*, a chip select signal CS*, a clock signal CK, and a clock enable signal CKE. During various memory operations, memory control unit 118 may generate signals, such as RdSel, EqDio, CTL, RdSel, EqCSA, EnRdSA, EnRdSA*, whose functions are described in more detail with reference to FIG. 3 and FIG. 4.

Memory device 100 of FIG. 1 may receive a supply voltage including supply voltage signals Vcc and Vss on lines 130 and 132, respectively. Supply voltage signal Vss may operate at a ground potential (having a value of approximately zero volts). Supply voltage signal Vcc may include an external voltage supplied to memory device 100 from an external power source such as a battery or an alternating current to direct current (AC-DC) converter circuitry. In some embodiments, supply voltage signal Vcc may have a value of approximately 1.5 volts. Supply voltage signals Vss and Vcc may also have other value.

As shown in FIG. 1, digit lines 105 may include digit line pairs such as a bit line pair having signals DL0 and DL0* and a bit line pair having signals DLN and DLN*. A person skilled in the art will readily recognize that two signals may be used to represent a bit of data that is read from or written into a memory cell of a memory device, e.g., a memory cell 103 of FIG. 1. The two signals may have different values (e.g., complementary values), one of which may correspond to the true value of the data, the other one may correspond to a complementary value of the data. For example, in a read operation of memory device 100, the DL0 and DL0* may present true and complementary values of the data read from one memory cell 103, and the DLN and DLN* signals may present true and complementary values of the data read from another memory cell 103. In this example, the signal DQ0 on lines 112 may correspond to the true value of the data read from a memory cell 103 and presented by the DL0 and DL0* signals, the signal DQN on lines 112 may correspond to the true value of the data read from a different memory cell 103 and presented by the DLN and DLN* signals.

As shown in FIG. 1, circuitry 111 may include a select circuit 115, which may respond to select signals CSEL0 through CSELN to select the DL0, DL0*, DLN, and DLN* signals that represent the values of data read from memory cells 103. Column access circuit 107 may selectively activate the CSEL0 through CSELN signals based on the address signals A0 through AX. Select circuit 115 may select the DL0, DL0*, DLN, and DLN* signals and then provide them to an input/output (I/O) circuit 116 as signals Din0, Din0*, Din-N, and Din-N*. I/O circuit 116 may include one or more circuit stages (e.g., one or more of circuit stages 270, 271, and 272 in FIG. 2) to receive the Din0, Din0*, Din-N, and Din-N* signals and then transfer them to lines 112 as the DQ0 and DQN signals. Thus, memory device 100 may transfer the DL0, DL0*, DLN, and DLN* signals that represent the values of data read from memory cells 103 to lines 120 as the DQ0 signal and DQN signals. For clarity, FIG. 1 shows an example of two pairs of signals (e.g., DQ0/DL0* pair and DLN/DLN* pair) on digit lines 105 and two signals (e.g., DQ0 and DQN) on lines 112. Memory device 100 may have many other signals on lines 105 (e.g., signals similar to DL0, DL0*, . . . , DLN, and DLN*) and many other signals on lines 112 (e.g., signals similar to DQ0, . . . , DQN).

FIG. 1 shows each of the DQ0, . . . , DQN signals in a single ended form (e.g., without a complementary signal such as a DQ0* signal associated with the DQ0 signal, and without a complementary signal such as a DQN* signal associated with the DQN signal). In some embodiments, memory device 100 may include differential forms (e.g., complementary form) of each of the DQ0 and DQN signals (e.g., including both DQ0 and DQ0* signals and both DQN and DQN* signals).

Memory device 100 may comprise a dynamic random access memory (DRAM) device, a static random access memory (SRAM) device, or other memory devices, or a combination of these memory devices. Memory device 100 may include other components, which are not shown to help focus on the embodiments described herein. Memory device 100 may be configured to include at least a portion of the memory device with associated structure or function or both structure and function described with reference to FIG. 2 through FIG. 8 below.

Figure 2:
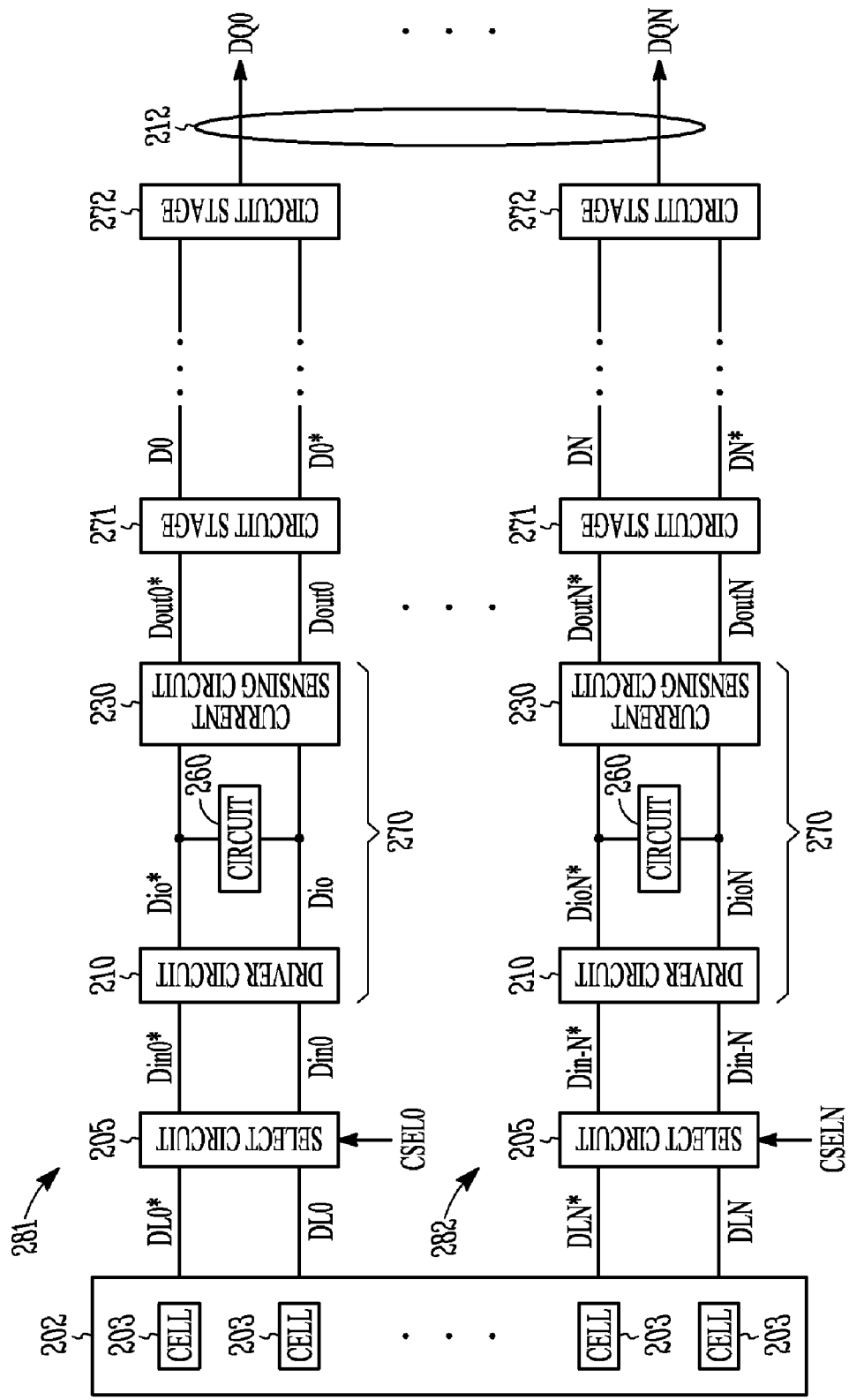
FIG. 2 shows a partial block diagram of a memory device including data paths according to an embodiment of the invention.

FIG. 2 shows a partial block diagram of a memory device 200 including data paths 281 and 282 according to an embodiment of the invention. Data paths 281 and 282 may transfer data read from memory cells 203 of memory array 202 to lines 212. The signals DQ0 through DQN on lines 212 may represent the data read from memory cells 203. Data paths 281 and 282 may form a portion of an I/O circuit of memory device 200 (similar to or identical to I/O circuit 116 of FIG. 1) in which the I/O circuit of memory device 200 may include other data paths 281 (not shown for clarity) to transfer data from lines 212 to memory cells 203.

Each of data paths 281 and 282 may include a select circuit 215 and circuit stages 270, 271, and 272 to transfer data from memory cells 203 to lines 212. Memory device 200 may include an access circuit, similar to or identical to column access circuit 107 of FIG. 1, to selectively activate select signals CSEL0 and CSELN. Select circuit 215 may respond to the CSEL0 and CSELN signals to select the DL0, DL0*, DLN, and DLN* signals and then provide them to circuit stages 270 as signals Din0, Din0*, Din-N, and Din-N*. Circuit stages 270, 271, and 272 may operate to generate the DQ0 and DQN signals based on the Din0, Din0*, Din-N, and Din-N* signals. The DL0, DL0*, Din0, Din0*, and QD0 signals on data path 281 and the DLN, DLN*, Din-N, Din-N* and QDN signals on data path 282 of FIG. 2 may correspond to those same signals shown in FIG. 1.

Data path 281 may also generate other signals such as Dio0 and Dio0*, Dout0 and Dout0*, D0 and D0* at various circuit stages of data path 281. Data path 282 may also generate other signals such as DioN and DioN*, DoutN and DoutN*, DN and DN* at various circuit stages of data path 282. As shown in FIG. 2, in each of data paths 281 and 282, the signals generated from one circuit or circuit stages may be provided as input signals to another circuit or circuit stage. For example, in data path 281, the Din0 and Din0* signals from select circuit 205 may be provided as input signals to circuit stage 270, which may use the Din0 and Din0* signals to generate the Dout0 and Dout0* signals. Then, the Dout0 and Dout0* signals may be provided as input signals to circuit stage 271, which may use the Dout0 and Dout0* signals to generate the Do0 and Do0* signals, and so on, until a last circuit stage of data path 281 (e.g., circuit stage 272) receive signals from the previous circuit stage to generate the signal DQ0 signal at lines 212.

Each of circuit stages 270, 271, and 272 may include one or more circuits. For example, circuit stage 270 of data path 281 may include a driver circuit 210 to receive the signals Din0 and Din0* and drive the Dio0 and Dio0* signals (e.g., by generating the Dio0 and Dio0* signals based on the Din0 and Din0* signals); a current sensing circuit 230 to generate the Dout0 and Dout0* signals based on current that is generated based on the Din0 and Din0* signals; and a circuit 260 to precharge and equilibrate the nodes having the Dio0 and Dio0* signals. Similarly, circuit stage 270 of data path 282 may include circuits 210, 230, and 260 to perform functions similar to or identical to those of circuits 210, 230, and 260 in data path 281.

As described above, data path 281 may operate to transfer the DL0 and DL0* signals (representing data read from memory cells 103) to lines 112 as the DQ0 signal. Data path 282 may operate to transfer the DLN and DLN* signals (representing data read from memory cells 103) to lines 112 as the DQN signal. In some embodiments, memory device 200 may include the memory device shown in FIG. 3.

Figure 3:
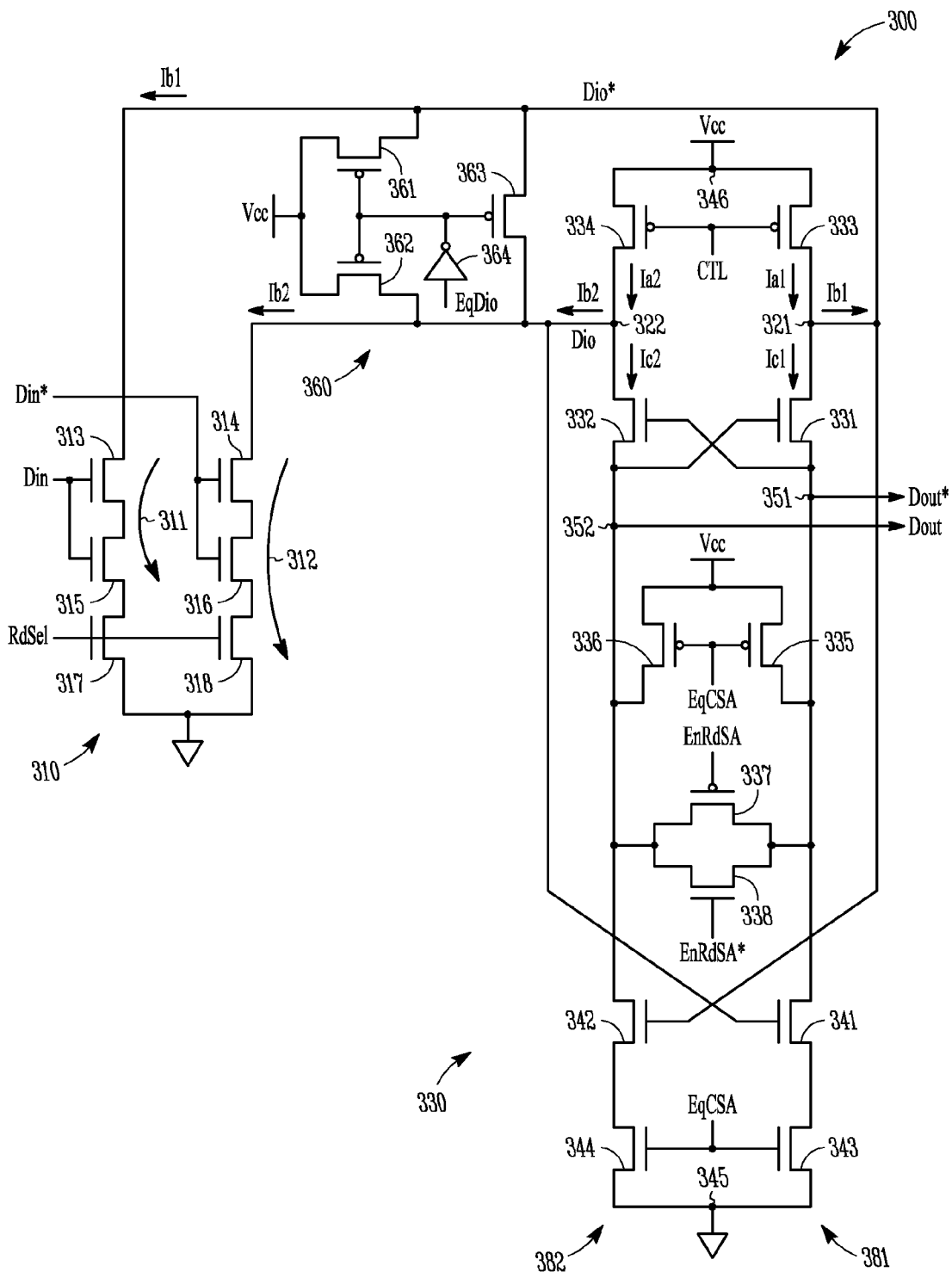
FIG. 3 shows a partial schematic diagram of a memory device including circuits to transfer signals according to an embodiment of the invention.

FIG. 3 shows a partial schematic diagram of a memory device 300 including circuits to transfer signals according to an embodiment of the invention. Memory device 300 may include a driver circuit 310 to receive signals Din and Din* and drive signals Dio and Dio* at nodes 321 and 322, a current sensing circuit 330 to generate signals Dout and Dout* at nodes 351 and 352 based on information (e.g., current, voltage, or both) at nodes 321 and 322, and a circuit 360 to precharge and equilibrate nodes 321 and 322. The Din and Din* signals in FIG. 3 may be provided by a select circuit of memory device 300 based on signals such as the signals DL0 and DL0* of FIG. 2. As described above with reference to FIG. 2, DL0 and DL0* may represent data within a memory cell (e.g., memory cell 203 of FIG. 2). Thus, in FIG. 3, since the Din and Din* signals may be provided based on signals such as the DL0 and DL0* signals, the Din and Din* signals may have values based on a value of data within a memory cell of memory device 300.

In some embodiments, one of the circuits 310, 330, and 360 or a combination of circuits 310, 330, and 360 may form a circuit stage in a data path of memory device 300 similar to or identical to circuit stage 270, 271, or 272 in data path 281 or 282 of FIG. 2. In some embodiments, circuit stage 270 of FIG. 2 may include circuits 310, 330, and 360 of FIG. 3 such that the Din and Din* signals may correspond to either the Din0 and Din0* signals of FIG. 2 or the Din-N and Din-N* signals of FIG. 2. The Dout and Dout* signals of FIG. 3 may correspond to either the Dout0 and Dout0* signals of FIG. 2, or the DoutN and DoutN* signals of FIG. 2.

Driver circuit 310 of FIG. 3 may include a circuit path 311 having transistors 313, 315, and 317 to enable the flow of current Ib1, and a circuit path 312 having transistors 314, 316, and 318 to enable the flow of current Ib2.

Circuit 360 may include transistors 361, 362, 363, and an inverter 364, responsive to a signal EqDio, to precharge nodes 321 and 322 to a selected voltage, e.g., by coupling nodes 321 to node 322 to Vcc. Circuit 360 may also equilibrate nodes 321 and 322, e.g., by coupling node 321 to node 322 during a time interval such as when nodes 321 and 322 are coupled to the selected voltage (e.g., Vcc).

Current sensing circuit 330 may include transistors 331 and 332 coupled to nodes 321 and 322 and nodes 351 and 352 as shown in FIG. 3. For example, transistors 331 and 332 may include non-gate terminals coupled to nodes 321 and 322 to receive currents Ic1 and Ic2, and gates (gate terminals) coupled to nodes 351 and 352. In the description herein, a non-gate terminal of a transistor refers to a terminal that is not a gate of a transistor. For example, a transistor (e.g., a p-channel or n-channel transistor) may include a gate (gate terminal), a source terminal, and a drain terminal, in which case the source and drain terminals of the transistor are designated as the non-gate terminals of the transistor.

Current sensing circuit 330 of FIG. 3 may include transistors 341 and 342, having their gates controlled by different signals (e.g., Dio and Dio*) to provide a voltage difference between the Dout and Dout* signals (e.g., by causing the voltage difference between the Dout and Dout* signals to have value relative to a value of the voltage difference between the Din and Din* signals). The different signals that controlled the gates of transistors 341 and 342 (e.g., Dio and Dio*) may include differential signals.

As shown in FIG. 3, transistors 341 and 342 may couple in forward fashion relative to nodes 351 and 352 (the output nodes of current sensing circuit 330) and nodes 321 and 322 (the input nodes of current sensing circuit 330). When coupled using forward fashion the gates of transistors 341 and 342 do not couple to nodes 351 and 352, but may couple to other nodes (e.g., nodes 321 and 322) such that the signals controlling the gates of transistors 341 and 342 depend on the signals at the other nodes (e.g., the Dio and Dio* signals).

As shown in FIG. 3, current sensing circuit 330 may include a circuit branch 381 having at least transistors 333, 331, 341, 343, and an output node 351; and a circuit branch 382 having at least transistor 334, 332, 342, 344, and an output node 352. Transistor 341 may be coupled between node 351 and a supply node 345. Transistor 342 may be coupled between node 352 and supply node 345. Transistors 333 and 334 may respond to a signal CTL to provide currents Ia1 and Ia2 to nodes 321 and 322. Transistors 343 and 344 may respond to a signal EqCSA to provide a path for currents flowing through transistors 341 and 342 to enter the supply node 345.

Current sensing circuit 330 may also include transistors 335 and 336 responsive to a signal EqCSA to precharge nodes 351 and 352 to a selected voltage (e.g., by coupling node to a voltage such as Vcc), and transistors 337 and 338 may be responsive to signals EnRdSA and EnRdSA* to equilibrate nodes 351 and 352.

As shown in FIG. 3, currents Ia1 and Ia2 may flow from a supply node 346 to nodes 321 and 322, respectively. Thus, current Ib1 may include a portion of current Ia1 that passes through node 321 to circuit path 311. Current Ic1 may include another portion of current Ia1 that passes through node 321 to a non-gate terminal of transistor 331. Similarly, current Ib2 may include a portion of current Ia2 that passes through node 322 to circuit path 312. Current Ic2 may include another portion of current Ia2 that passes through node 322 to a non-gate terminal of transistor 332.

The relationship between currents Ia1 and Ia2 may be expressed as follows, Ia1=Ia2 (e.g., when RdSel is not activated or when transistors 317 and 318 turn off), or Ia1 is approximately equal to Ia2 (e.g., when RdSel is activated or when transistors 317 and 318 turn on). The relationship among the currents flowing through nodes 321 and 322 may be expressed as follows, Ia1=Ib1+Ic1 and Ia2=Ib2+Ic2. Currents Ic1 and Ic2 may have values based on the values of the Din and Din* signals. For example, when the value of the Din signal is greater than the value of the Din* signal, current Ib1 on circuit path 311 (after RdSel is activated to turn on transistors 317 and 318) may have a value greater than that of current Ib2 on circuit path 312. As described herein, since Ia1=Ia2=Ib1+Ic1=Ib2+Ic2, when Ib1 is greater than Ib2 (e.g., when Din is greater than Din*), Ic1 may be less than Ic2. Thus, a difference in current values between Ib1 and Ib2 may develop when a voltage difference between Din and Din* develops. In response to the difference in current values between Ib1 and Ib2, a difference in current values between Ic1 and Ic2 may also develop. Current sensing circuit 330 may operate to sense the difference in current values between currents Ic1 and Ic2 to generate the Dout and DOut* signals with appropriate values.

As described above, currents Ic1 and Ic2 may have values based on the values of the Din and Din* signals. Since the Din and Din* signals may have values based on a value of data within a memory cell of memory device 300, currents Ic1 and Ic2 may also have values based on a value of data within a memory cell of memory device 300. Operations of the memory device 300 of FIG. 3 will now be described with reference to both FIG. 3 and FIG. 4.

Figure 4:
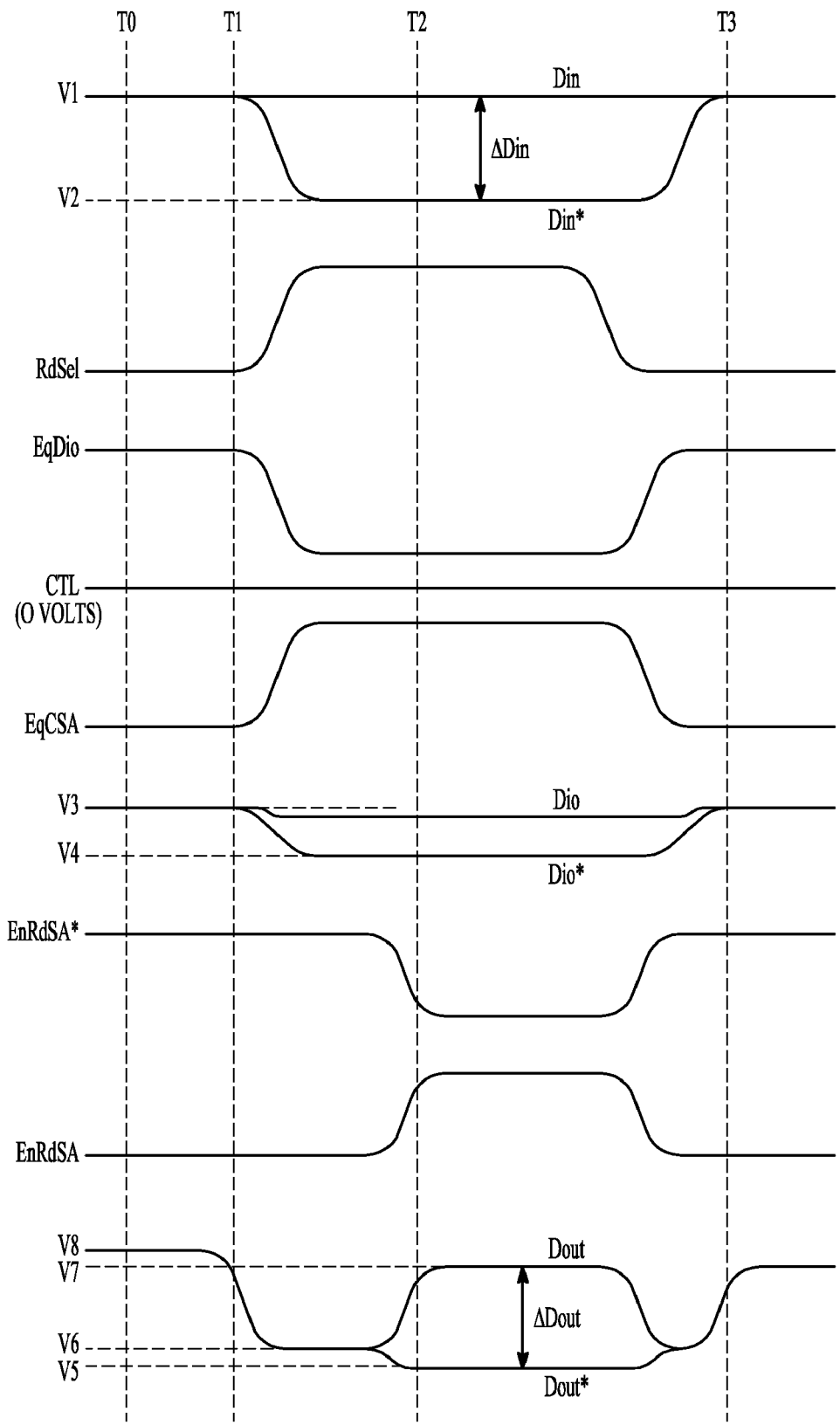
FIG. 4 is a timing diagram showing waveforms of various signals for the memory device of FIG. 3.

FIG. 4 is a timing diagram showing waveforms of various signals for memory device 300 of FIG. 3. In FIG. 4 T0, T1, and T2 represent instances in time. Memory device 300 of FIG. 3 may include a select circuit (not shown), which may be similar to or identical to select circuit 115 of FIG. 1 or select circuit 215 of FIG. 2. In FIG. 4, the interval between times T0 and T1 may include a time interval before the select circuit of memory device 300 activates a select signal (e.g., a signal similar to or identical to CSEL0 or CSELN of FIG. 1 or FIG. 2) to provide the Din and Din* signals to driver circuit 310.

During memory operations, between times T0 and T1, the Din and Din* signals may have an equal or approximately equal voltage value (e.g., V1), the Dout and Dout* signals may have an equal or approximately equal voltage value (e.g., V8). In some embodiments, each of the voltages V1 and V8 may have a value approximately equal to a value of a supply voltage (e.g., Vcc) of memory device 300.

Between times T0 and T1, the RdSel, EqDio, CTL, EqCSA, EnRdSA, and EnRdSA* signals may have signal levels as shown in FIG. 4. Between times T1 and T2 (e.g., at time T1), the RdSel, EqDio, and EqCSA may change their signal levels, causing the Dout and Dout* signals to change from voltage V8 to voltage V6. The value of V6 may include a value between V8−Vt (V8 minus Vt) and ground, where Vt is the value of the threshold voltage of a transistor (e.g., approximately 0.3 volt to approximately 0.4 volt). In some embodiments, V6 may include a ground potential value. Din and Din* signals having a voltage difference ΔDin (delta Din) may be provided to driver circuit 310 (FIG. 3) after time T1. As shown in FIG. 3, after time T1 (e.g., between times T2 and T3), Din may have a value of V1 and Din* may have a value of V2 such that ΔDin may have a value of V1−V2 (V1 minus V2). In some embodiments, V2 may include a ground potential value. Between times T2 and T3 (e.g., at time T2), the EnRdSA and EnRdSA* signals may change their signal levels to enable current sensing circuit 330 (FIG. 3) to perform a sensing function, which may cause the signals Dout and Dout* to change their values. For example, the Dout signal may go to a voltage V7 lower than V8 and the Dout* signal may go a voltage V5 lower than V6. Thus, between times T2 and T3, current sensing circuit 330 may generate the Dout and Dout* signals with a voltage difference ΔDout (delta Dout) as shown in FIG. 4. In some embodiments, V7 may have a value lower than that of V8 by approximately 200 millivolts to approximately 300 millivolts. After time T3 of FIG. 4, processes similar to the process shown between times T0 and T3 may occur repeatedly.

As shown in FIG. 4, between times T0 and T1, the RdSel signal may have a low signal level to turn off transistors 317 and 318 (FIG. 3) and turn off driver circuit 310 (e.g., by disabling the flow of current Ib1 and Ib2 on circuit paths 311 and 312). The EqDio may have a high signal level to turn on transistors 361, 362, and 363 to precharge and equilibrate nodes 321 and 322. The CTL signal may have a low signal level to turn on transistors 334 and 333 to provide currents Ia1 and Ia2 to nodes 321 and 322, respectively. The EqCSA signal may have a low signal level to turn on transistors 335 and 336 to precharge nodes 351 and 352 to a selected voltage (e.g., Vcc). The EnRdSA and EnRdSA* signals may have low and high signal levels, respectively, to turn on transistors 337 and 338 to equilibrate nodes 351 and 352.

Thus, as shown in FIG. 4 between times T0 and T1, nodes 351 and 352 may have an equal or approximately equal value such that the Dout and Dout* signals may also have an approximately equal or equal value (e.g., V8). In the description herein, "low" and "high" levels of a signal are relative to each other and refer to different values (e.g., voltage or current values) of the signal at different times, rather than to any particular values of voltage or current for a selected signal.

At time T1 in FIG. 4, a voltage difference ΔDin between the Din and Din* signals may develop. For example, ΔDin may develop after a select circuit (not shown) of memory device 300 activates a select signal to provide Din and Din* to driver circuit 310.

At time T1 in FIG. 4, each of the RdSel, EqDio, and EqCSA signals may change to a different signal level (e.g. from low to high or from high to low) as shown in FIG. 4. When the RdSel signal changes to a high signal level, transistors 317 and 318 (FIG. 3) may turn on, turning on driver circuit 310. Thus, currents Ib1 and Ib2 may pass through nodes 321 and 322 and flow on circuit paths 311 and 312. When the EqDio signal changes to a low signal level, transistors 361, 362, and 363 may turn off to decouple nodes 321 and 322 from each other and from the selected voltage (e.g., Vcc) that couples to nodes 321 and 322 before time T1. Thus, the Dio and Dio* signals at nodes 321 and 322 may have different voltage values (e.g., V3 and V4 in FIG. 4). When the EqCSA signal changes to a high signal level, transistors 336 and 337 may turn off to decouple nodes 351 and 352 from the selected voltage (e.g., Vcc) that couples to nodes 351 and 352 before time T1. When the EqCSA signal changes to a high signal level, transistors 343 and 344 may turn on and couple nodes 351 and 352 to supply node 345 through transistor 341 and 342. Thus, the value of the Dout and Dout* signals at nodes 351 and 352 between times T1 and T2 (FIG. 4) may move to voltage V6.

At time T2, the EnRdSA and EnRdSA* signals may change to high and low signal levels, respectively, to decouple node 351 from node 352, allowing the Dout and Dout* signals to go to their respective values based on the values of currents Ic1 and Ic2, and the values of the Din and Din* signals. As described above, Ic1 may be less than Ic2. Current sensing circuit 330 may thus operate to sense currents Ic1 and Ic2, generating the Dout and Dout* signals with a voltage difference of ΔDout.

As described above, the Dout and DOut* signals may have a voltage difference ΔDout when the Din and Din* signals have a voltage difference ΔDin. In some embodiments, as a result of controlling the gates of transistors 341 and 342 (FIG. 3) with different signals (e.g., Dio and Dio*), ΔDout may have a value equal to at least one-half of the value of ΔDin. In some embodiments, ΔDout may have a value approximately equal to or greater than the value of ΔDin.

In some embodiments, the supply voltage of memory device 300 (e.g., Vcc in FIG. 3) may have a value of approximately 1.5 volts. In some embodiments, voltages V3 and V4 (FIG. 4) may have a voltage difference of approximately 20 millivolts to approximately 400 millivolts. In some embodiments, voltage V3 may have a value of approximately 700 millivolts to approximately 1.4 volts. In some embodiments, ΔDin (FIG. 4) may have a value of approximately 50 millivolts to approximately 1.5 volts. In some embodiments, ΔDout (FIG. 4) may have a value of approximately 200 millivolts to approximately 1.2 volts. In some embodiments, ΔDout may have a value of several times more than that of ΔDin. For example, ΔDin may have a value of approximately 150 millivolts and ΔDout may have a value of approximately 800 millivolts to approximately 1.4 volts.

In this description, when two values (e.g., values of ΔDin and ΔDout) are said to be approximately equal, or are said to be equal, it means that a difference of 20 millivolts or less, for example, may exist between the two components. Further, when a component (e.g., V1, V2, V5, V7, and ΔDin or ΔDout) is said to have a value of "approximately" X volts (where X is a real number), it means that the component may have a value equal to X, or between X plus 20 millivolts and X minus 20 millivolts, for example.

As shown in FIG. 3, the gates of transistors 341 and 342 may couple to different nodes 321 and 322 with different signals to affect a voltage difference (e.g., ΔDout in FIG. 4) between the Dout and Dout* signals. In some embodiments, the gates of transistors 341 and 342 may couple to the same node or the same signal (e.g., Vcc or Vss) instead of the different signals (e.g., Dio and Dio* of FIG. 3). In some cases, however, coupling the gates of transistors 341 and 342 to the same signal may cause the value of ΔDout to be different from the value of ΔDout obtained when different signals are coupled. For example, if the gates of transistors 341 and 342 couple to the same node or the same signal, ΔDout in FIG. 4 may have a lower value than the one shown in FIG. 4, such as lower than the difference between V7 and V5. In some embodiments, when Vcc (FIG. 3) is approximately 1.5 volts and ΔDin (FIG. 4) is approximately 50 millivolts to approximately 800 millivolts, coupling the gates of transistors 341 and 342 to different signals (e.g., Dio and Dio*) may result in ΔDout having a value of approximately 700 millivolts to approximately 1.4 volts, whereas if the gates of transistors 341 and 342 couple to the same signal, ΔDout may have a value of less than approximately 700 millivolts to approximately 1.4 volts (e.g., approximately 250 millivolts). In some cases, a relatively lower value of ΔDout (when the gates of transistors 341 and 342 couple to the same signal) may result in the desirability of using relatively more circuit stages to transfer the signal Dout and Dout* (FIG. 3) on a data path of memory device 300, leading to a relatively lower data transfer speed, larger device size, or higher power consumption, or a combination of these factors.

Therefore, controlling the gates of transistors 341 and 342 with different signals (e.g., the Dio and Dio* signals) may result in ΔDout (FIG. 4) with a value (e.g., approximately 700 millivolts to 1.4 volts) such that, in some embodiments, one or more circuit stages coupled to circuits 310, 330, and 360 (such as one or more circuit stages 271 and 272 of FIG. 2) may be omitted from memory device 300, leading to a relatively higher data transfer speed, smaller device size, or lower power consumption, or a combination of these factors.

Figure 5:
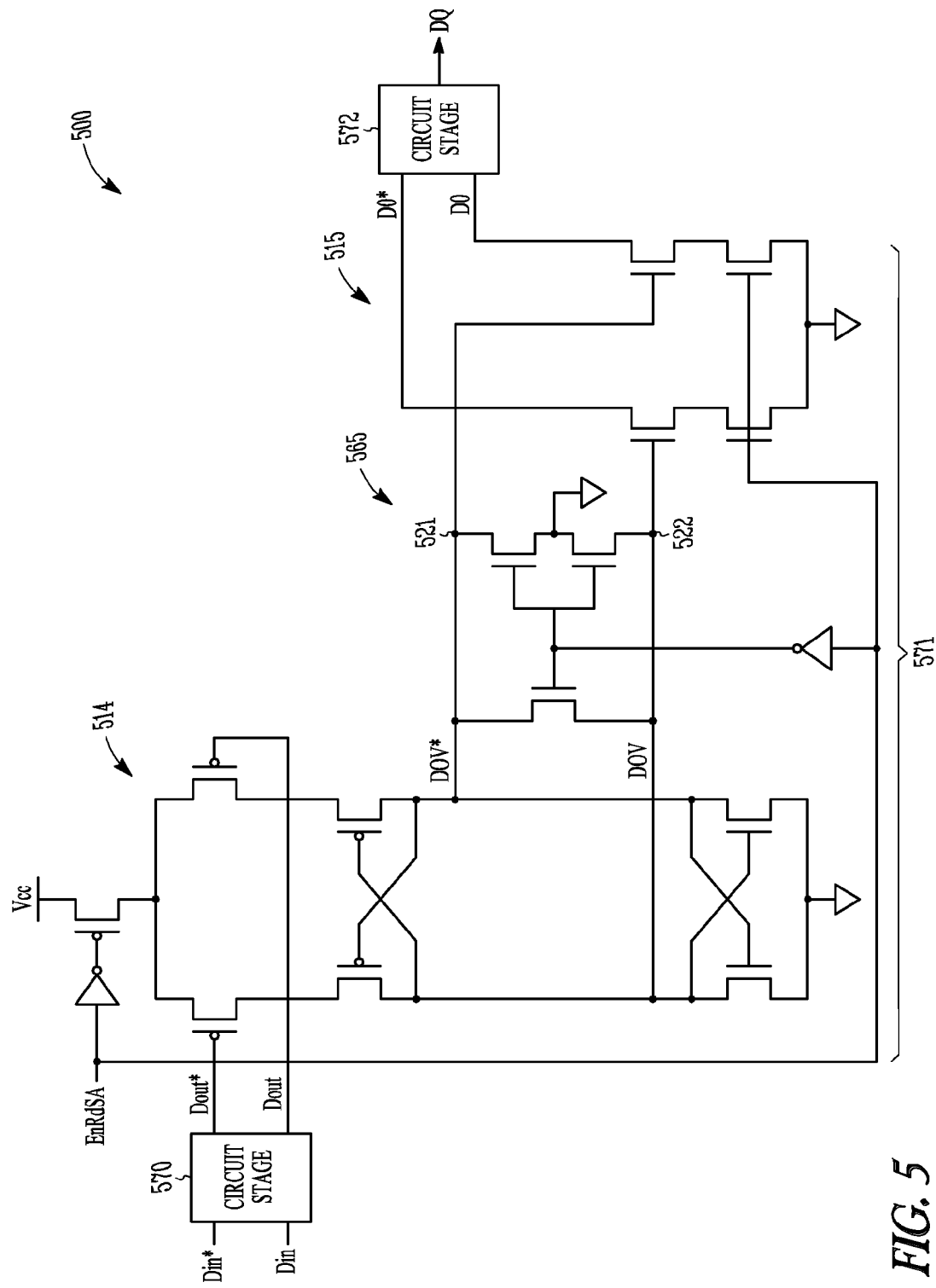
FIG. 5 shows a partial schematic diagram of a memory device including circuit stages according to an embodiment of the invention.

FIG. 5 shows a partial schematic diagram of a memory device 500 including circuit stages 570, 571, and 572 according to an embodiment of the invention. In some embodiments, memory device 200 of FIG. 2 may include memory device 500 of FIG. 5 such that circuit stages 570, 571, and 572 of FIG. 5 correspond to circuit stages 270, 271, and 272 of FIG. 2. The Din, Din*, D0, D0*, and DQ signals in FIG. 5 may correspond to the Din0, Din0*, D0, D0*, and DQ0 signals of FIG. 2, or correspond to the Din-N, Din-N*, DN, DN*, and DQN signals of FIG. 2. In some embodiments, circuit stage 570 of FIG. 5 may include circuits 310, 330, and 360 of FIG. 3 such that the Din, Din*, Dout, and Dout* signals of FIG. 5 may correspond to the same signals shown in FIG. 3.

In FIG. 5, circuit stage 571 may include a voltage sensing circuit 514 to receive the Dout and Dout* signals (provided by circuit stage 570) and to generate signals D0V and D0V* based in a voltage difference between the Dout and Dout* signals. Circuit stage 571 may also include a circuit 565 to precharge and equilibrate nodes 521 and 522 to a selected voltage (e.g., ground potential), and a driver circuit 515 to receive the D0V and D0V* signals and to drive the D0 and D0* signals.

Circuit stage 571 may receive a signal EnRdSA, which may be similar to or identical to the signal EnRdSA signal of FIG. 3. The EnRdSA signal in FIG. 5 may be activated at appropriate times to allow circuit stage 571 to properly generate the D0V and D0V* signals based on the Dout and Dout* signals. For example, the EnRdSA signal may have a low signal level before circuit stage 571 receive the Dout and Dout* signals (e.g., before the Dout and Dout* signals have a voltage difference such as ΔDout in FIG. 4) to allow circuit 565 to couple nodes 521 and 522 to a selected voltage (e.g., ground potential). The EnRdSA signal may have a high signal level when circuit stage 571 receive the Dout and Dout* (e.g., when the Dout and Dout* signals have a voltage difference such as ΔDout in FIG. 4) to decouple node 521 from node 522 and enable voltage sensing circuit 514 to sense a voltage difference between the Dout and Dout* signals, and to generate the D0V and D0V* signals. Driver circuit 515 may also respond to the EnRdSA signal (e.g., when the EnRdSA signal has high signal level) to receive the D0V and D0V* signals to drive the D0 and D0* signals to a next circuit stage such as circuit stage 572.

Circuit stage 572 may receive the D0 and D0* signals and generate the DQ signal. In some embodiments, circuit stage 572 may include one or more circuits similar to or identical to one or more circuits 310, 330, and 360 of FIG. 3. For example, circuit stage 572 may include a current sensing circuit similar to or identical to current sensing circuit 330 of FIG. 3 to receive the D0 and D0* signals and to generate output signals based on the D0 and D0* signals. Circuit stage 572 may also include other circuits (e.g., output drivers or output buffers) to receive the output signals from the current sensing circuit of circuit stage 572 to generate the DQ signal.

Figure 6:
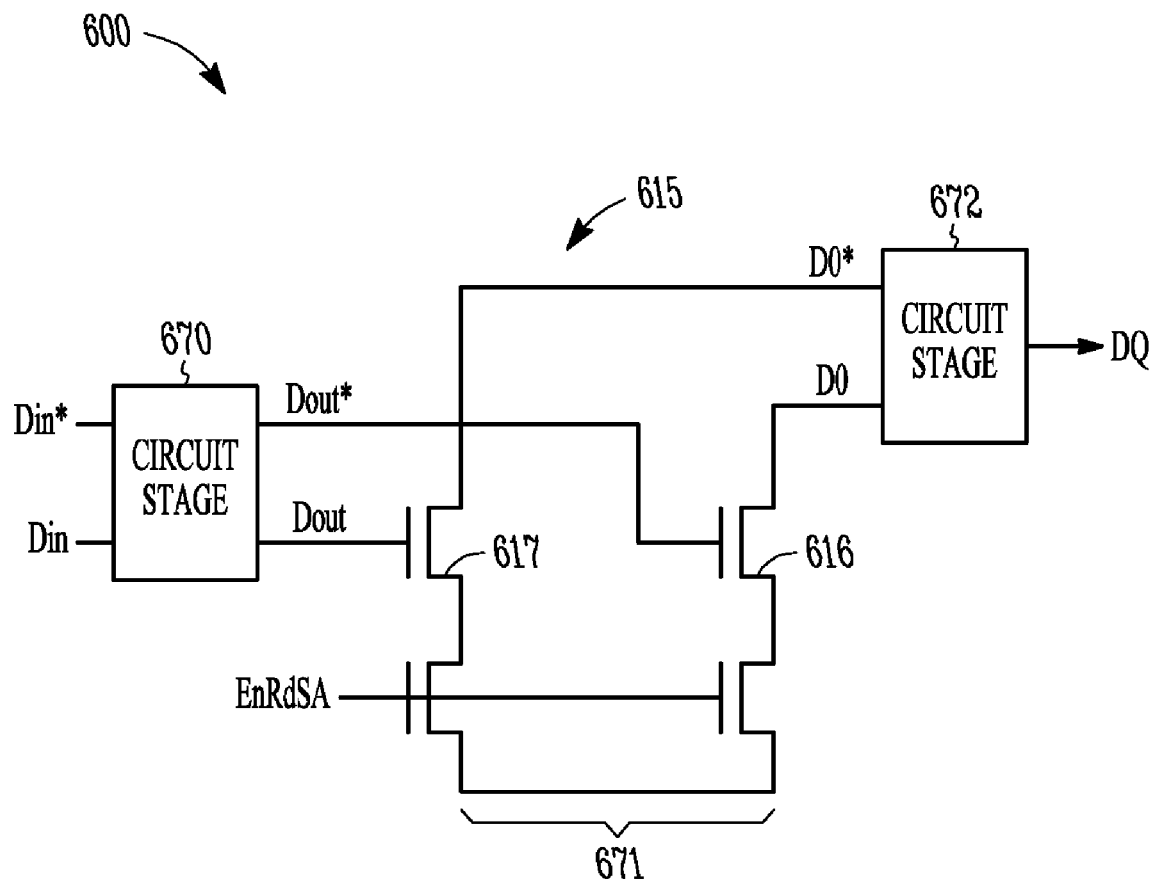
FIG. 6 shows a partial schematic diagram of a memory device including circuit stages with reduced circuit components according to an embodiment of the invention.

FIG. 6 shows a partial schematic diagram of a memory device 600 including circuit stages 670, 671, and 672 with reduced circuit components according to an embodiment of the invention. In some embodiments, memory device 200 of FIG. 2 may include memory device 600 of FIG. 6 such that circuit stages 670, 671, and 672 of FIG. 6 may correspond to circuit stages 270, 271, and 272 of FIG. 2 and the Din, Din*, D0, D0*, and DQ signals in FIG. 6 may correspond to Din0, Din0*, D0, D0*, and DQ0 or Din-N, Din-N*, DN, DN*, and DQN signals of FIG. 2.

In FIG. 6, circuit stage 671 may include a driver circuit 615 to receive the Dout and Dout* signals and drive the D0 and D0* signals. Circuit stage 671 may receive a signal EnRdSA, which may be similar to or identical to the EnRdSA signal of FIG. 3. Driver circuit 615 may respond to the EnRdSA signal (e.g., when the EnRdSA signal has high signal level) to receive the Dout and Dout* signals (e.g., when the Dout and Dout* signals have a voltage difference such as ΔDout in FIG. 4) and drive the D0 and D0* signals to a next circuit stage such as circuit stage 672. Circuit stage 672 may receive the D0 and D0* signals and generate the DQ signal. In some embodiments, circuit stage 672 may include one or more circuits similar to or identical to one or more circuits 310, 330, and 360 of FIG. 3. For example, circuit stage 672 may include a current sensing circuit similar to or identical to current sensing circuit 330 of FIG. 3 to receive the D0 and D0* signals and to generate output signals based on the D0 and D0* signals. Circuit stage 672 may also include other circuits, e.g., output drivers or output buffers, to receive the output signals from the current sensing circuit of circuit stage 672 and to generate the DQ signal.

In some embodiments, circuit stage 670 of FIG. 6 may include circuits 310, 330, and 360 of FIG. 3, such that the Din, Din*, Dout, and Dout* signals of FIG. 6 may correspond to those same signals of FIG. 3. Thus, in some embodiments, the voltage difference between the Dout and Dout* signals (e.g., ΔDout in FIG. 4) may have a sufficient value such that driver circuit 615 can be directly coupled to circuit stage 570 without going through additional circuitry (e.g., without circuits 514 and 565 in circuit stage 571 of FIG. 5) to directly receive the Dout and Dout* signals and to drive the D0 and D0* signals. For example, as shown in FIG. 6, transistors 616 and 617 of driver circuit 615 may have gates that directly receive the Dout and Dout* signals and non-gate terminals to and drive the D0 and D0* signals.

In comparison to a memory device such as memory device 500 of FIG. 5, memory device 600 may have relatively fewer circuit components. For example, circuit components such as circuits 514 and 565 in circuit stage 571 of FIG. 5 may be omitted from circuit stage 671 of memory device 600 of FIG. 6. Thus, in comparison to a memory device such as memory device 500 of FIG. 5, fewer circuit components in memory device 600 may result in memory device 600 having a relatively higher data transfer speed along a circuit path, e.g., the circuit path between the Dout/Dout* and the D0/D0* signals. In comparison to a memory device such as memory device 500 of FIG. 5, fewer circuit components in memory device 600 may also result in memory device 600 having a relatively smaller device size (perhaps reducing cost), or lower power consumption, or both.

Figure 7:
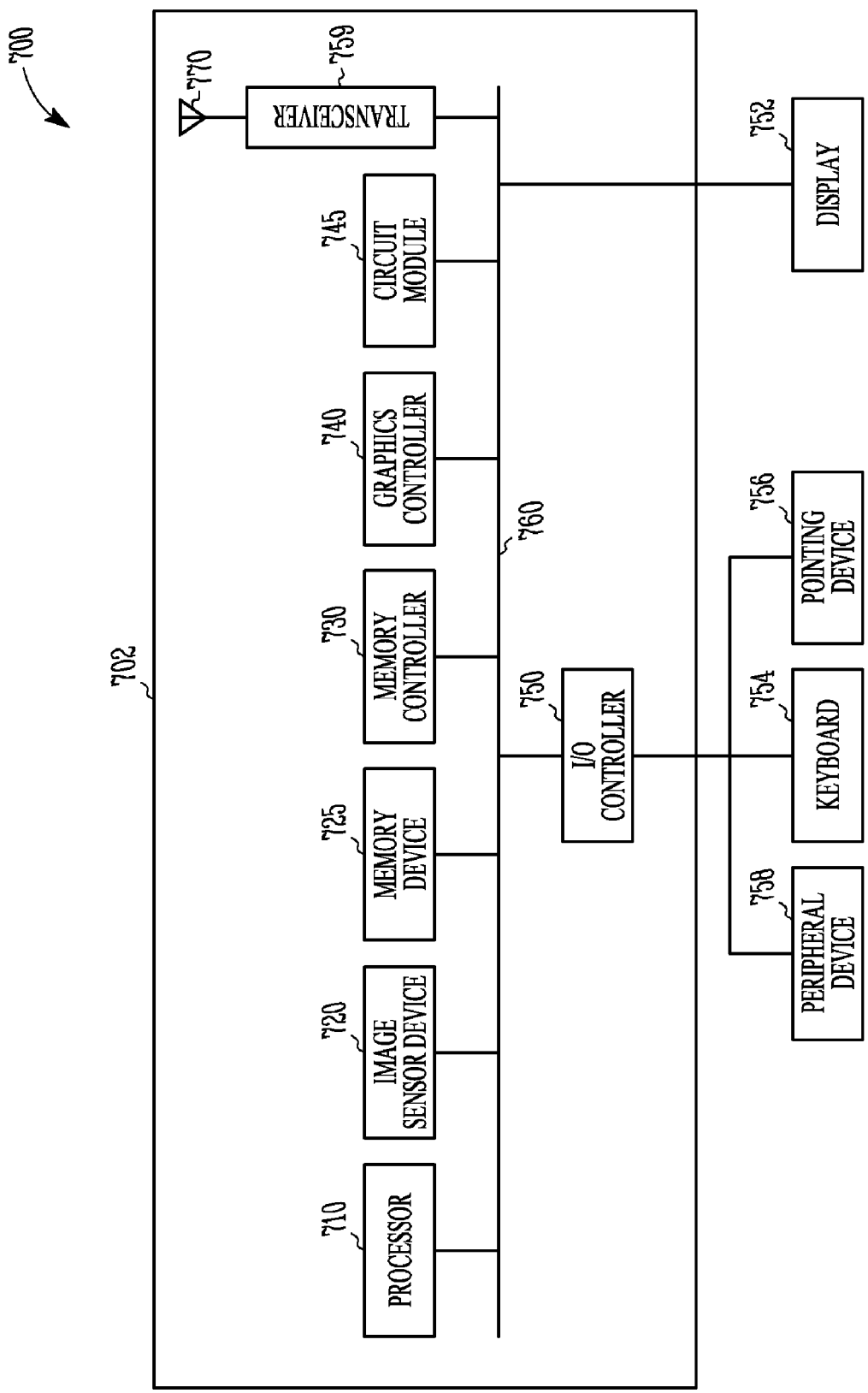
FIG. 7 shows a system according to an embodiment of the invention.

FIG. 7 shows a system 700 according to an embodiment of the invention. System 700 may include a processor 710, an image sensor device 720, a memory device 725, a memory controller 730, a graphics controller 740, a circuit module 745, an input and output (I/O) controller 750, a display 752, a keyboard 754, a pointing device 756, a peripheral device 758, a transceiver 759, a bus 760 to transfer information among the components of system 700, and an antenna 770 to wirelessly transmit and receive information to and from system 700. Transceiver 759 may operate to transfer information between one or more the components of system 700 (e.g., at least one of processor 710 and memory device 725) and antenna 770. The information received at antenna 770 may be transmitted to system 700 by a source (not shown) external to system 700.

System 700 may also include a circuit board 702 on which some components of system 700 may be located. In some embodiments, the number of components of system 700 may vary. For example, in some embodiments, system 700 may omit one or more of display 752, image sensor device 720, memory device 725, and circuit module 745.

Processor 710 may include a general-purpose processor or an application specific integrated circuit (ASIC). Processor 710 may include a single core processor or a multiple-core processor. Processor 710 may execute one or more programming commands to process information. The information may include digital output information provided by other components of system 700, such as by image sensor device 720 or memory device 725.

Image sensor device 720 may include a complementary metal-oxide-semiconductor (CMOS) image sensor having a CMOS pixel array or charge-coupled device (CCD) image sensor having a CCD pixel array.

Display 752 may include an analog display or a digital display. Display 752 may receive information from other components. For example, display 752 may receive information that is processed by one or more of the image sensor device 720, memory device 725, graphics controller 740, and processor 710 to display information such as text or images.

Circuit module 745 may include a circuit module of a vehicle. Circuit module 745 may receive information from other components to activate one or more subsystems of the vehicle. For example, circuit module 745 may receive information that is processed by one or more of the image sensor device 720, memory device 725, and processor 710, to activate one or more of an air bag system of a vehicle, a vehicle security alarm, and an obstacle alert system.

Memory device 725 may include a volatile memory device, a non-volatile memory device, or a combination of both. For example, memory device 725 may include a DRAM device, a static random access memory (SRAM) device, a flash memory device, or other memory devices, or a combination of these memory devices. In some embodiments, memory device 725 includes a memory device (e.g., memory devices 100, 200, 300, 500, and 600) as described above with reference to FIG. 1 through FIG. 6.

The illustrations of apparatus such as memory devices 100, 200, 300, 500, and 600 and systems such as system 700 are intended to provide a general understanding of the structure of various embodiments and not a complete description of all the elements and features of apparatus and systems that might make use of the structures described herein. In the description above, signals noted as being in a high (high signal level or high state) or low (low signal level or low state) are described in that matter for purposes of illustration and not limitation. Other states, including opposite states, may be used.

The novel apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 8:
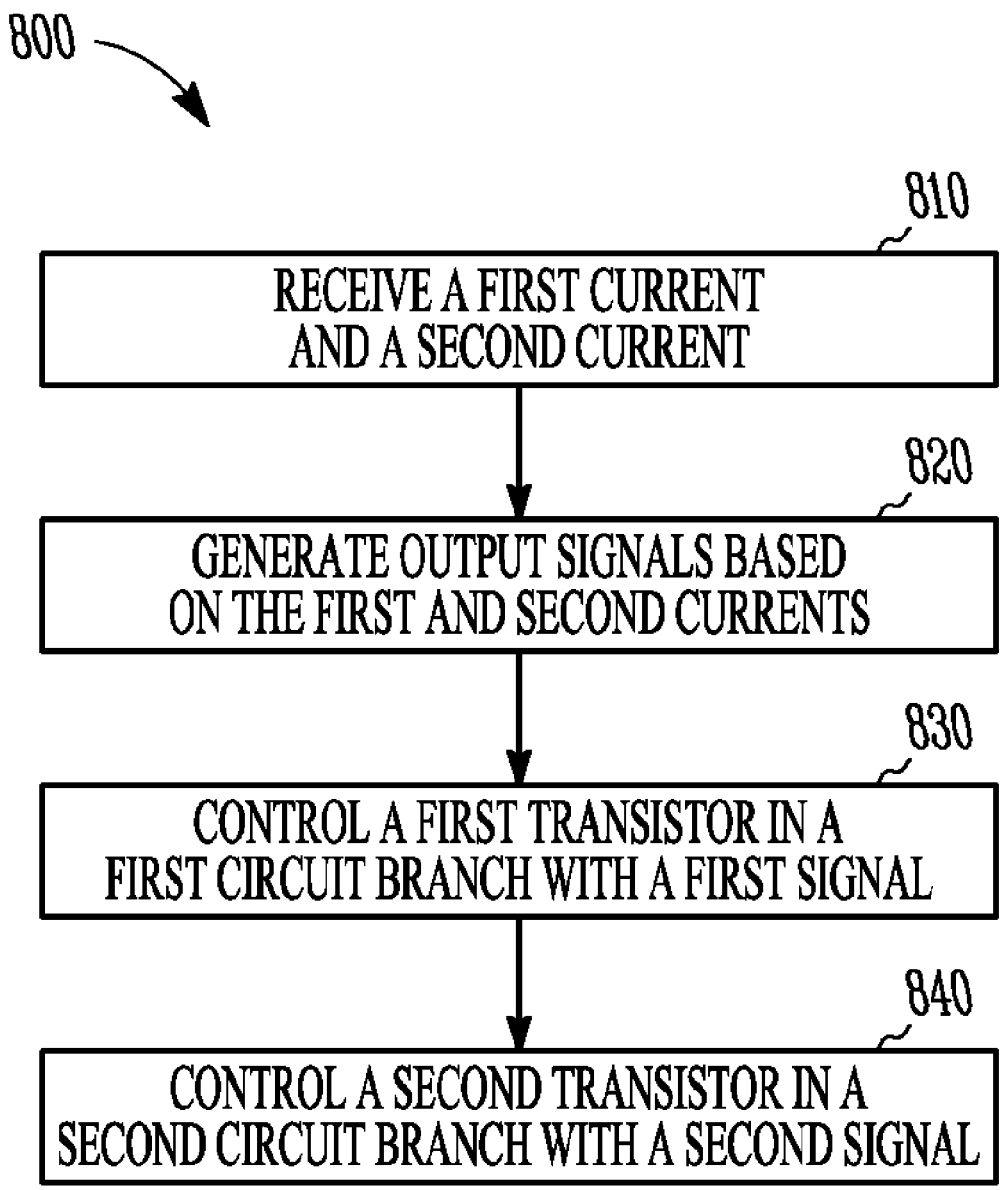
FIG. 8 is flow diagram showing a method according to an embodiment of the invention.

FIG. 8 is flow diagram showing a method 800 according to an embodiment of the invention. Activity 810 may include receiving a first current and a second current at a circuit. The first and second currents may have values based on the value of data within at least one memory cell of a device. Activity 820 may include generating output signals based on the first and second currents. Activity 830 may include controlling a first transistor in a first circuit branch of the circuit with a first signal. Activity 840 may include controlling a second transistor in a second branch of the circuit with a second signal. The first and second signals may include different signals from the output signals. Controlling the first and second transistors with different signals in activities 830 and 840 may affect a value of a voltage difference between the output signals in relation to the value of input signals that used to provide the first and second current. In some embodiments, the memory device used in method 800 may include memory device 100, 200, 300, 500, 600, and 725, as described above with reference to FIG. 1 through FIG. 7. Thus, in some embodiments, method 800 may include any one or more activities and operations of a memory device described above with reference to FIG. 1 through FIG. 7. The individual activities of method 800 do not have to be performed in the order shown or in any particular order. Some activities may be repeated, and others may occur only once. Various embodiments may have more or fewer activities than those shown in FIG. 8.

CONCLUSION

One or more embodiments described herein include apparatus, systems, and methods comprising a first circuit to receive input signals and to drive signals at first circuit output nodes, a second circuit to receive at least a portion of current passing through the first circuit output nodes and to generate output signals at second circuit output nodes, the second circuit including a pair of transistors coupled to the second circuit output nodes with gates of the pair of transistors to receive different signals to affect a value of a voltage difference between the output signals, the different signals being different from the output signals. Other embodiments including additional apparatus, systems, and methods are described above with reference to FIG. 1 through FIG. 8.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
   a first circuit to drive signals at first circuit output nodes; and
   a second circuit to generate output signals at second circuit output nodes, the second circuit including a first transistor coupled between a supply node and a first node of the second circuit output nodes and a second transistor coupled between the supply node and a second node of the second circuit output nodes, each of the first and second transistors including a gate coupled to one of the first and second nodes.

2. The apparatus of claim 1, wherein the second circuit includes at least one transistor to couple the first node to the second node.

3. The apparatus of claim 2, wherein the second circuit includes at least one additional transistor to couple the second circuit output nodes to an additional supply node supply node.

4. The apparatus of claim 1 further comprising a third circuit to couple a first node of the first circuit output nodes to a second node of the first circuit output nodes.

5. The apparatus of claim 4, wherein the third circuit includes at least one transistor to couple the first circuit output nodes to an additional supply node.

6. The apparatus of claim 1, wherein the first circuit includes nodes to receive signals having values based on a value within at least one memory cell of a device.

7. An apparatus comprising:
   a first circuit to receive input signals based on signals from lines used to transfer data within at least one memory cell of a device, to drive a first signal at a first node, and to drive a second signal at a second node; and
   a second circuit to sense current passing through the first and second nodes and generate output signals at second circuit output nodes, the second circuit including a pair of transistors with gates controlled by voltages at the first and second nodes to affect values of the output signals.

8. The apparatus of claim 7 further comprising:
   a circuit stage including a pair of transistors with gates to receive the output signals and to generate additional output signals based on the output signals; and
   a third circuit to receive the additional output signals and to drive signals at additional nodes.

9. The apparatus of claim 8 further comprising an additional circuit stage including a pair of transistors with non-gates coupled to the additional nodes and to generate at least one second additional output signal based on the additional output signals.

10. The apparatus of claim 7 further comprising a circuit stage including a first transistor with a gate coupled to one of the second circuit output nodes and a non-gate terminal to drive a first additional output signal, and a second transistor with a gate coupled to another one of the second circuit output nodes and a non-gate terminal to drive a second additional output signal.

11. The apparatus of claim 10, wherein the first circuit includes:
   a first circuit path having a transistor coupled between the first node and a supply node, the transistor having a gate controlled by a first signal of the input signals; and
   a second circuit path having a transistor coupled between the second node and the supply node, the transistor of the second circuit path having a gate controlled by a second signal of the input signals.

12. The apparatus of claim 11 further comprising a third circuit to couple the first node to the second node.

13. The apparatus of claim 12, wherein the third circuit includes at least one transistor to couple the first and second nodes to an additional supply node.

14. A method comprising:
   passing a first current through a first node and passing a second current through a second node;
   generating output signals at a first output node and a second output node based on the first and second currents;
   controlling a current in a first circuit branch between the first output node and a supply node based on a voltage at the second node; and
   controlling a current in a second circuit branch between the second output node and the supply node based on a voltage at the first node.

15. The method of claim 14, wherein a value of the first current and a value of the second current are based on a value within at least one memory cell of a device.

16. The method of claim 14, wherein controlling the current in the first circuit branch includes controlling a current through a transistor coupled between the first node and the first output node in the first circuit branch.

17. The method of claim 16, wherein controlling the current in the second circuit branch includes controlling a current through a transistor coupled between the second node and the second output node in the first circuit branch.

18. The method of claim 14, wherein controlling the current in the first circuit branch includes controlling a current through a transistor coupled between the first output node and the supply node.

19. The method of claim 18, wherein controlling the current in the second circuit branch includes controlling a current through a transistor coupled between the second output node and the supply node.

20. The method of claim 14 further comprising:
   coupling the first node to the second node during a first time; and
   decoupling the first node from the second node during a second time.

* * * * *

UNITED STATES PATENT AND TRADEMARK OFFICE
CERTIFICATE OF CORRECTION

PATENT NO. : 8,068,374 B2
APPLICATION NO. : 12/625035
DATED : November 29, 2011
INVENTOR(S) : Huy T. Vo Page 1 of 1

It is certified that error appears in the above-identified patent and that said Letters Patent is hereby corrected as shown below:

In column 12, line 67, in Claim 3, after "supply node" delete "supply node".

Signed and Sealed this
Twenty-first Day of February, 2012

David J. Kappos
*Director of the United States Patent and Trademark Office*